United States Patent [19]

Tateno

[11] Patent Number: 4,733,459
[45] Date of Patent: Mar. 29, 1988

[54] ELECTRONIC PART INSERTION APPARATUS

[75] Inventor: Eiji Tateno, Shimotsuga, Japan

[73] Assignee: Fujitsu Limited, Kawasaki, Japan

[21] Appl. No.: 886,425

[22] Filed: Jul. 17, 1986

[30] Foreign Application Priority Data

| Jul. 17, 1985 | [JP] | Japan | 60-156026 |
| Jul. 17, 1985 | [JP] | Japan | 60-156028 |
| Jul. 17, 1985 | [JP] | Japan | 60-156030 |
| Jul. 17, 1985 | [JP] | Japan | 60-156031 |
| Jul. 18, 1985 | [JP] | Japan | 60-156914 |

[51] Int. Cl.$^4$ .......................................... H05K 3/30
[52] U.S. Cl. ..................................... 29/741; 29/759; 198/463.6; 209/573; 414/224; 901/7
[58] Field of Search ............... 29/741, 740, 837-839, 29/759; 209/573, 574; 414/224; 901/7; 324/158 F; 198/463.6, 345

[56] References Cited

U.S. PATENT DOCUMENTS

| 4,070,753 | 1/1978 | Liu | 29/741 |
| 4,222,166 | 9/1980 | Kurek et al. | 29/741 X |
| 4,250,615 | 2/1981 | Knuth et al. | 29/741 |
| 4,304,514 | 12/1981 | Pfaff | 29/741 X |
| 4,327,483 | 5/1982 | Zemek et al. | 29/741 |
| 4,567,652 | 2/1986 | Gussman et al. | 29/741 X |

FOREIGN PATENT DOCUMENTS 0080512  6/1983  European Pat. Off. ............. 29/741

Primary Examiner—Carl E. Hall
Attorney, Agent, or Firm—Staas & Halsey

[57] ABSTRACT

An electronic part insertion apparatus which includes an inclined portion inclined by a predetermined inclination angle and having at least one inclined surface on which electronic parts having leads slide to descend under their own weight. An intermittent feeding mechanism is arranged in the middle of the inclined portion to feed intermittently the electronic parts, and a positioning mechanism is provided at a lower portion of the inclined portion to stop and position the electronic parts on the inclined surface. A hand portion is arranged to be pivotable to hold the positioned electronic part at a first position and to insert the held electronic part into a printed circuit board at a second position.

16 Claims, 15 Drawing Figures

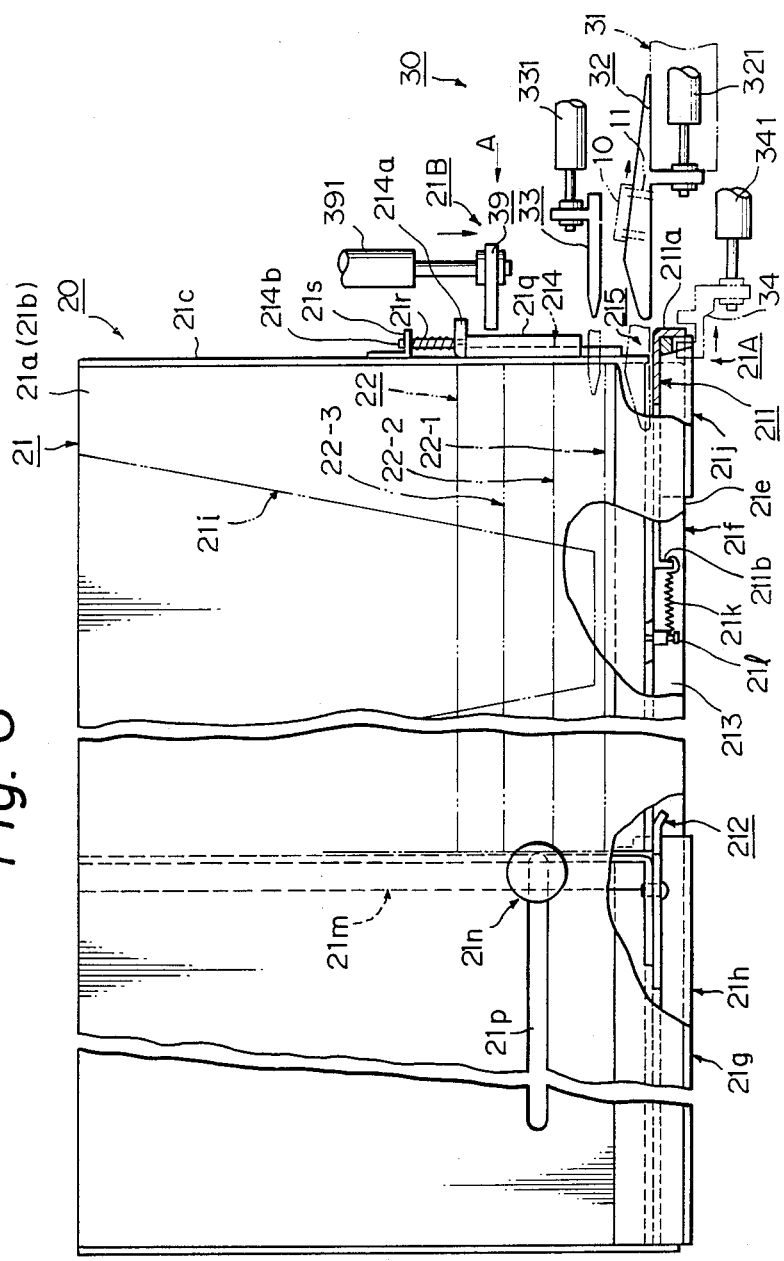

Fig. 11A
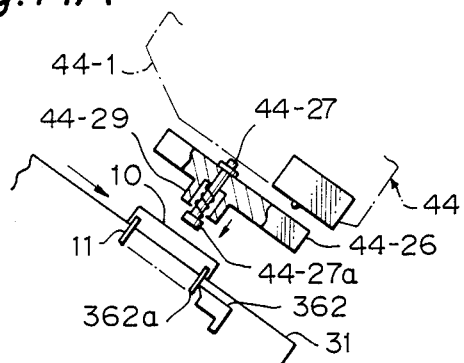
Fig. 11B
Fig. 11C
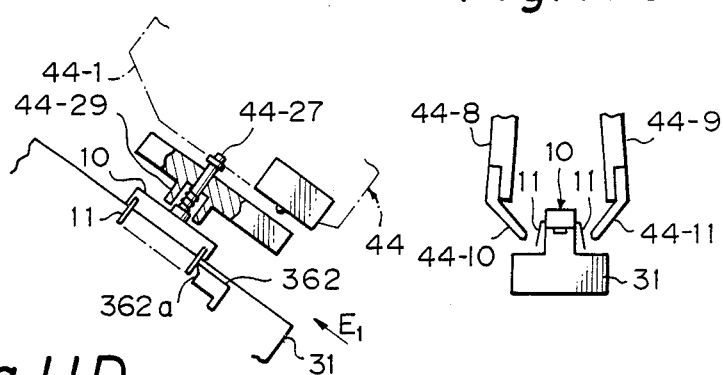
Fig. 11D
Fig. 11E
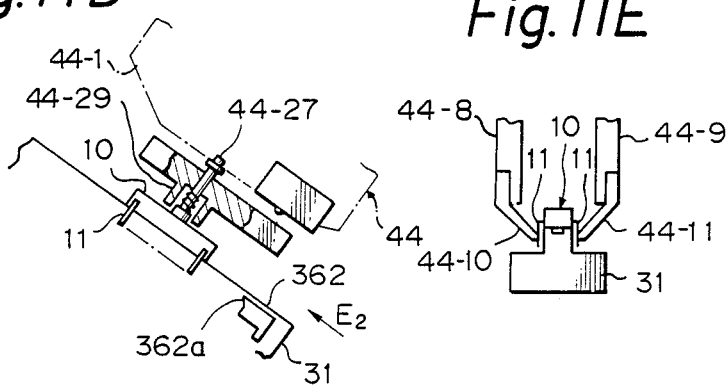

ELECTRONIC PART INSERTION APPARATUS

BACKGROUND OF THE INVENTION

1. Field of the Invention

The present invention relates to an electronic part insertion apparatus for inserting a large number of the same kind of electronic parts having leads, such as ICs (integrated circuits), into a printed circuit board to perform a heating test, etc., of the electronic parts.

2. Description of the Related Art

In a conventional electronic part having leads, such as an IC, the IC is formed to have a function guarantee maximum temperature of 60° C. to 70° C. in an ambient temperature, and is formed practically to have a certain safety factor (margin) with respect to that temperature. However, defective or nearly defective ICs having defects or an inferior reliability sometimes occur. Therefore, before actually packaging the ICs on a printed circuit board, the ICs are usually tested by a high temperature heating test (so called "burn-in test") to confirm their acceptability. The high temperature heating test is performed under adverse conditions after housing many ICs of the same kind in a constant temperature oven (thermostatic chamber).

Namely, a number of ICs, for example, 100, are inserted into a testing printed circuit board directly or through sockets. A plurality, for example, ten, of the printed circuit boards are stacked one upon another in a box-like shelf, the shelf being stacked in the thermostatic chamber. Connectors of the printed circuit boards are engaged with connectors provided inside the thermostatic chamber, and a temperature in the thermostatic chamber is increased to a predetermined high value (for example, 120° C.). A voltage (for example, 5 V), which is equivalent to the voltage actually used by the IC, is applied to respective ICs to cause the ICs to generate heat, and this state is maintained for a predetermined period of time (for example, 72 hours or 48 hours) to complete the high temperature heating test. Through this high temperature heating test, ICs having certain defects will be broken or damaged, and are thus rejected. After the heating test, a function test is performed on the ICs by a tester to determine acceptable and not acceptable ICs, and the accepted ICs are then packaged on a printed circuit board.

When carrying out the high temperature heating test according to the prior art on the same kind of electronic parts such as ICs having leads, in most cases a worker must wear a grounding band when manually inserting the ICs one by one into a printed circuit board directly, or through sockets mounted on the printed circuit board. Therefore, according to the prior art method mentioned above, a long time is required for manually inserting the ICs one by one into the testing printed circuit board, and the work efficiency is seriously affected. Also, although the worker is grounded when inserting the ICs, static electricity tends to flow from the body of worker to the ICs and has an undesirable effect on the ICs, because the worker's hands must directly touch the ICs.

SUMMARY OF THE INVENTION

To solve the problems mentioned above, an object of the present invention is to provide an electronic part insertion apparatus having a simple structure, which can automatically insert ICs into a printed circuit board to greatly shorten the time needed for insertion of the ICs, and which can prevent static electricity from flowing to the ICs.

Another object of the present invention is to provide an electronic part insertion apparatus having hollow bar-like stick containers (hereinafter, stick containers) in which electronic parts accommodated in the stick containers of the electronic part insertion apparatus can be fed continuously to an inclined portion, and an empty stick container can be smoothly dropped and discharged, thereby contributing to the smooth automatic insertion of the electronic parts.

Still another object of the present invention is to provide an electronic part insertion apparatus having an electronic part positioning mechanism. The electronic part positioning mechanism is disposed at an inclined portion of the electronic part insertion apparatus, has a simple structure, reliably feeds electronic parts having leads one by one on the inclined portion, and at a lower end portion of the inclined portion, correctly positions the electronic parts on an inclined surface of the inclined portion, thereby contributing to the smooth automatic insertion of the electronic parts.

A further object of the present invention is to provide an electronic part insertion apparatus having an electronic part holding mechanism. The electronic part holding mechanism is disposed on an inclined portion of the electronic part insertion apparatus, has a simple structure, and securely holds electronic parts having leads which have been positioned on the inclined portion of the electronic part insertion apparatus, thereby contributing to the smooth automatic insertion of the electronic parts.

A still further object of the present invention is to provide an electronic part insertion apparatus having a hand portion having a simple structure, which can efficiently and securely insert electronic parts having leads into a printed circuit board, thereby contributing to the smooth automatic insertion of the electronic parts.

To accomplish the objects mentioned above, the present invention provides an electronic part insertion apparatus for inserting a large number of the same kind of electronic parts having leads into a printed circuit board, comprising: an inclined portion inclined by a predetermined inclination angle and having an inclined surface on which electronic parts having leads slide to descend by their own weight; a positioning mechanism provided at a lower portion of the inclined portion to stop and position the electronic parts on the inclined surface; and a hand portion arranged to be pivotable around predetermined supporting points toward the lower portion of the inclined portion to clamp, at a first pivoted position, each electronic part which has been positioned on the inclined portion, and then at a second pivoted position, to insert the clamped electronic part into a printed circuit board 15 which is located horizontally.

The present invention further provides an electronic part insertion apparatus having stick containers for accommodating and feeding the same kind of electronic parts having leads, and an inclined portion is provided with an inclined guide rail located adjacent to a stick container portion to allow the electronic parts fed from the stick containers to slide downward. The stick container portion comprises a stick container holding member for holding a plurality of long size stick containers stacked one upon another with their front sides inclined downward, each of the stick containers accommodating the electronic parts in series; a stick container receiving mechanism for receiving and holding the stick containers at the bottom of the stick container holding member and for dropping and discharging an empty stick container; and a gate opening/closing mechanism for feeding the electronic parts to a lower forefront portion of the stick container holding member. An upper end portion of the inclined guide rail is arranged to face the lower forefront portion of the stick container holding member. At the upper end portion of the inclined guide rail, there are provided an electronic part guide member which is movable in a back and forth direction and temporarily engages with a stick container on a first story in the holding member, and a stick container thrusting portion which is arranged above the guide member to be movable in a back and forth direction and temporarily engages with a stick container on a second story in the stick container holding member to temporarily hold the stick container.

BRIEF DESCRIPTION OF THE DRAWINGS

These and other objects and features of the present invention will become apparent from the following description with reference to the accompanying drawings, in which:

FIGS. 4A and 4B are views showing a stick container for accommodating the ICs having leads (electronic parts having leads), in which FIG. 4A is a side view and FIG. 4B an end view;

FIGS. 5A and 5B are views showing an IC having leads (an electronic part having leads), in which FIG. 5A is a side view and FIG. 5B an end view;

FIG. 6 is a schematic side view (not inclined) showing an embodiment of the present invention;

FIGS. 10A and 10B are views showing a hand 44 according to an embodiment of the present invention, in which FIG. 10A is a side view and FIG. 10B a front view; and FIGS. 11 and 12 are views explaining the operation of an embodiment of the present invention.

DESCRIPTION OF THE PREFERRED EMBODIMENTS

Figure 1:
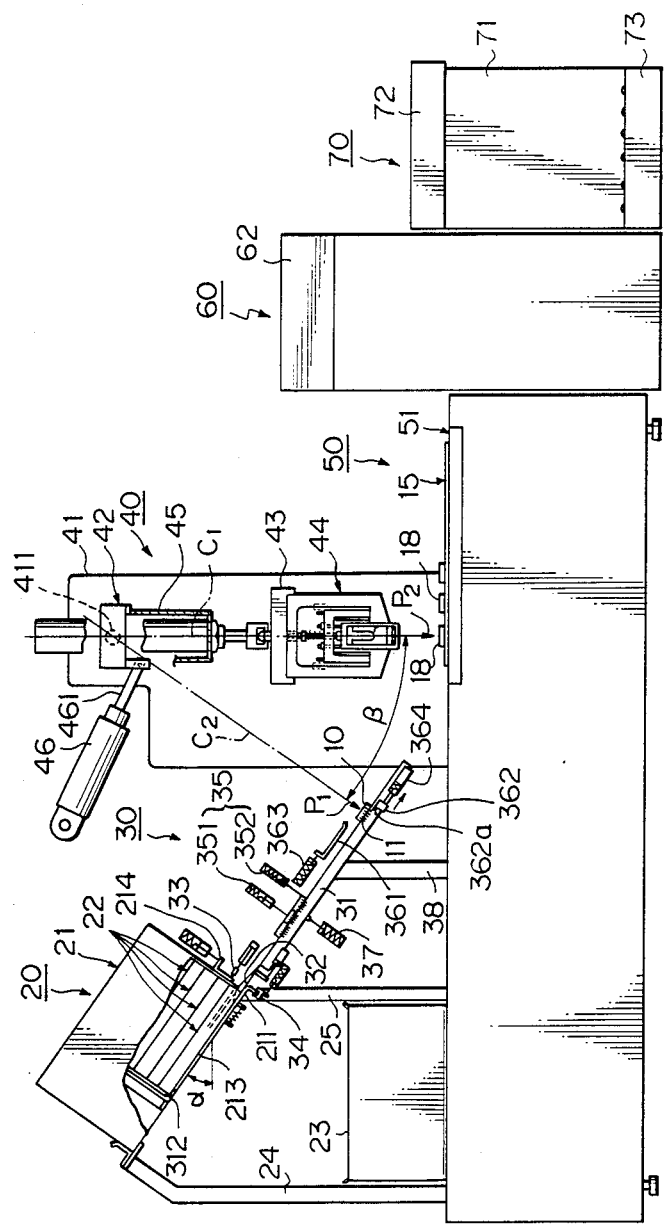
FIG. 1 is a schematic side view showing an electronic part insertion apparatus according to the present invention.
Figure 2:
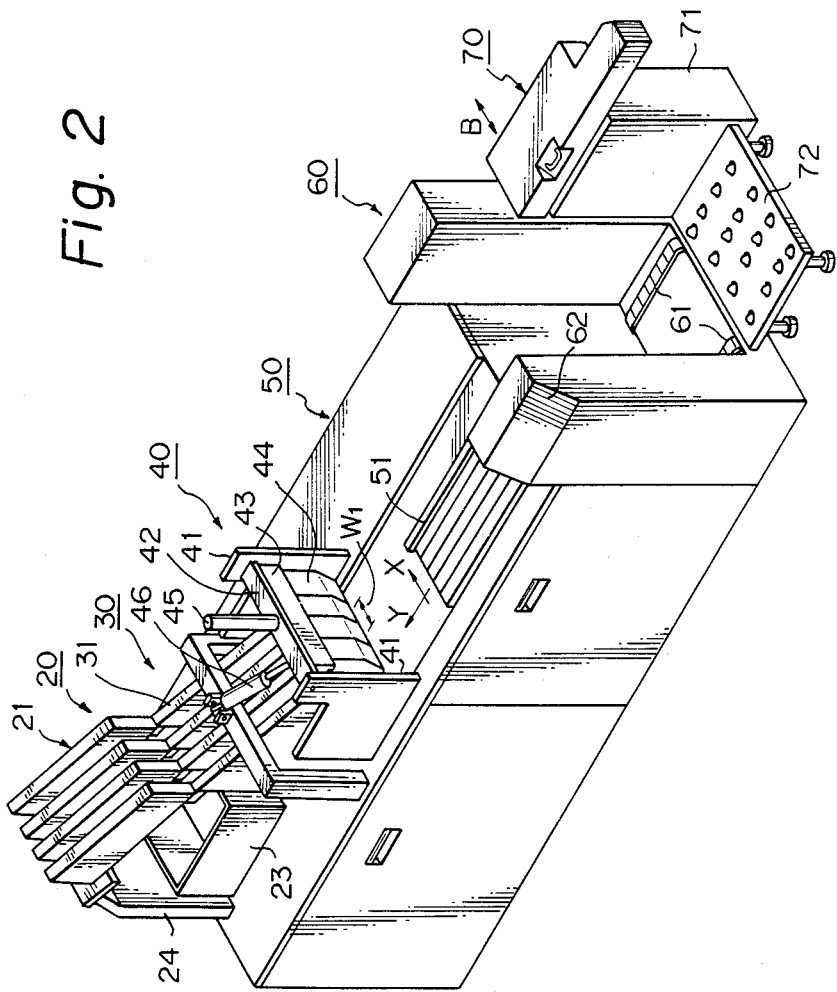
FIG. 2 is a perspective view showing the appearance of the electronic part insertion apparatus shown in FIG. 1.
Figure 3:
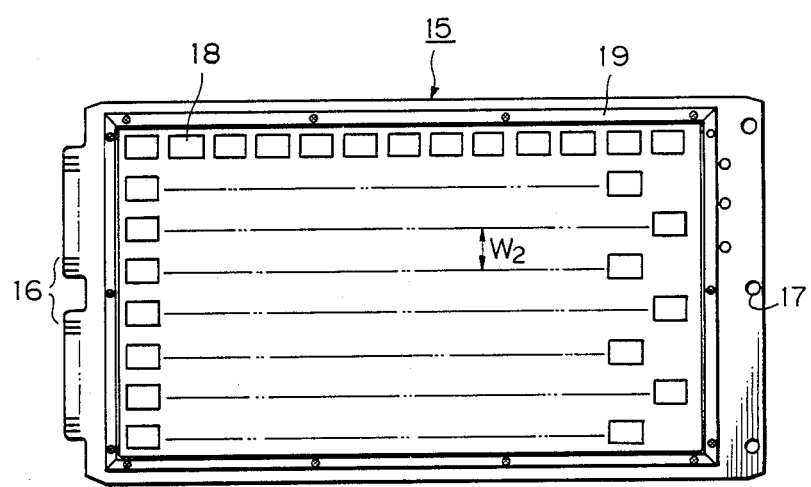
FIG. 3 is a plan view showing an example of a testing printed circuit board 15.
Figure 4A:
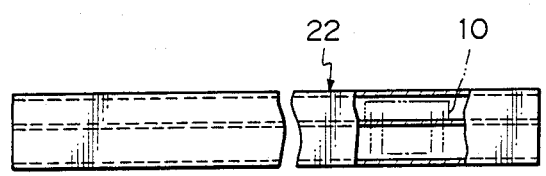
Figure 4B:
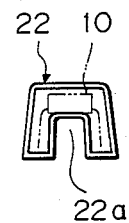

FIG. 1 is a schematic side view showing an electronic part insertion apparatus according to the present invention, FIG. 2 a perspective view of the electronic part insertion apparatus shown in FIG. 1, FIG. 3 a plan view showing an example of a testing printed circuit board, and FIGS. 4A and 4B views showing a stick container for accommodating ICs 10 which are electronic parts having leads, in which FIG. 4(A) is a side view and FIG. 4(B) an end view. In FIG. 1, the left-hand side thereof defines the rear of the apparatus and components, and the right-hand side defines the front thereof.

Facing the apparatus from the front, the left-hand side defines the left side of the apparatus and components, and the right-hand side defines the right side thereof.

First, the overall constitution and action of the insertion apparatus will be briefly described with reference to FIGS. 1 and 2. The apparatus comprises a stick container portion 20 provided at the rear of the apparatus; an inclined portion 30 provided in front of the stock container portion 20 to feed ICs (electronic parts); a hand portion 40 provided at the lower end and in front of the inclined portion 30; an X-Y table 50 extending frontward from a lower portion of the hand portion 40; an elevator portion 60 provided in front of the X-Y table; and a printed circuit board operating portion 70 disposed in front of the elevator portion 60.

The stick container portion 20 comprises a plurality (four in this embodiment) of stick container cassettes 21 which are arranged side by side with their front ends inclined downward by a predetermined angle $\alpha$ ($\alpha = 35°$ in this embodiment), and a plurality (for example, ten) of stick containers 22 are stacked one upon another in each stick container cassette 21. As shown in FIG. 4, the stick container 22 is made of transparent plastic and formed in the shape of a long hollow bar (for example, 300 to 600 mm in length) having an upside-down U-shape hollow cross section to accommodate a plurality (for example, 20 to 30) of ICs 10 in series. In FIGS. 1 and 2, 211 represents a stick container front receiving member provided at a bottom portion of the stick container cassette 21 and movable back and forth; 212 a stick container rear receiving member; 213 an opening portion provided between the members 211 and 212 for passing and dropping an empty stick container 22; 214 a gate opening/closing plate provided at a lower front end portion of the stick container cassette 21 and movable up and down; 23 a receiver box for receiving empty stick containers 22; and 24 and 25 stick container cassette support frames, respectively. The ICs 10 received in the stick container 22, and then in the stick container cassette 21, slide downward from an opening in the front portion of the cassette container 21 under their own weight and are fed to the inclined portion 30, which will be described later. The empty stick container 22 drops into the receiver box 23 to be received therein.

The inclined portion 30 is inclined by an inclination angle $\alpha$ (in this embodiment, $\alpha = 35°$), which is the same angle as that at which the stick container cassette 21 is inclined, and provided with a plurality (in this embodiment, four) of guide rails 31 corresponding to respective stick container cassettes 21. At an upper end portion of each guide rail 31, there are provided an IC guide member 32, a stick container thrusting member 33, and a receiving member actuating piece 34. In the middle of guide rails 31, there is provided an IC intermittent feeding mechanism 35 comprising a pair of cylinders 351 and 352. At the lower end portion of the guide rails 31, there is provided an IC positioning mechanism 36 comprising guide plates 361 and positioning pieces 362. The numeral 37 represents a vibration cylinder for applying impact vibrations to the guide rails 31 to assist the smooth sliding of the ICs 10; and 38 a guide rail support frame.

In the hand portion 40, a pivotable plate 42 is pivotably supported by a pair of left and right side plates 41 through a supporting shaft 411, and a hand supporting plate 43 is connected to the pivotable plate 42 in such a manner that the supporting plate 43 is movable up and down. A plurality (four, in this embodiment) of hands 44 are arranged side by side and fixed to the supporting plate 43. A cylinder 45 for moving the hands 44 up and down, and a cylinder 46 for pivoting the hands 44 back and forth around the supporting shaft 411 are provided for the hand portion 40. The hands 44 hold the ICs 10 which have been positioned on the guide rails 31 to transfer the ICs 10 onto the printed circuit board 15 which is arranged horizontally and to insert the ICs into the printed board.

The X-Y table portion 50 has an X-Y table 51 which moves the printed circuit board 15 fixed thereon in X and Y directions to position the printed circuit board 15 in accordance with the ICs 10 to be inserted, which are held by the hand 44. As shown in FIG. 3, the printed circuit board 15 is formed as a testing printed circuit board and provided with a connector 16 at one end and a pulling hole 17 at the other end. On the upper surface of the printed circuit board 15, sockets 18 are mounted for receiving the ICs 10, the sockets 18 being arranged in eight rows comprising 13-piece rows and 12-piece rows which are alternately arranged, i.e., 100 pieces in total. A reinforcing frame 19 having an L-shape cross section is fixed on the periphery of printed circuit board 15.

The elevator portion 60 is provided with a pair of left and right endless chains 61 (FIG. 2) which can descend and ascend. By these chains 61, a shelf (not shown) accommodatiing a plurality (for example, ten) of printed circuit boards 15 stacked in a multistory state is pulled and arranged on the chains 61, and moved up and down corresponding to the X-Y table as and when required. The numeral 62 represents a control panel.

The printed circuit board operating portion 70 is slidable in a left and right direction (a direction indicated by an arrow marked B in FIG. 2) on a base 71. A shelf carrier 72 having a plurality of ball rollers is disposed at a lower portion of the base 71 corresponding to the chains 61. If the shelf is mounted on the carrier 72, the operating portion 70 is retracted to the side (the right side in this embodiment) as shown in FIG. 2, and moved into a center portion of the left and right direction after the shelf is received in the elevator portion 60 from the carrier 72. Then, an operation bar (not shown) incorporated in the operation portion 70 pushes a printed circuit board 15 stored in the shelf onto the X-Y table 51, and after the ICs are inserted into the printed circuit board 15, pulls the printed circuit board 15 back into the shelf by hooking an operation bar to the pulling hole 17 (FIG. 3).

The present invention is characterized in that the apparatus is provided with the inclined portion 30 positioning mechanism 36, and the hand portion 40. As shown in FIGS. 1 and 2, the inclined portion 30 corresponds to respective stick container cassettes 21 stored in the stick container portion 20, and has a plurality (four, in this embodiment) of guide rails 31 which are inclined by an inclination angle of $\alpha$ ($\alpha=35°$), which is the same angle as that at which the stick container cassette 21 is inclined, and are fixed on the supporting frame 38. Upper end portions of the guide rails 31 are arranged to communicate with the stick container cassettes 21 respectively, and lower end portions thereof are provided with the IC positioning mechanism 36. By arranging the guide rails in an inclined state as mentioned above, the ICs 10 fed from the cassette 21 automatically slide downward on the inclined surfaces (upper surfaces) of the guide rails 31, under their own weight, and are fed one by one by an IC intermittent feeding mechanism 35 to continue their slide downward. The ICs 10 are then stopped and positioned by the IC positioning mechanism 36 at the lower end portions of the guide rails 31. The IC positioning mechanism 36 comprises guide plates 361 and positioning pieces 362. The guide plates 361 are arranged corresponding to the positioning pieces 362, substantially in parallel with the upper surfaces of the guide rails 31, and with predetermined gaps from the upper surfaces of the ICs 10. The guide plates 361 are supported by supporting members (not shown) in such a manner that the guide plates 361 can reciprocate in a back and forth direction (a longitudinal direction of the guide rails 31), and are driven by a cylinder 363. When the ICs 10 descend, the front ends of the guide plates 361 move near to the positioning pieces 362 from the positions shown in FIG. 1, so that the guide plates 361 will prevent the ICs 10 from jumping out of position when the ICs abut against the positioning pieces 362. The guide plates 361 then return to the positions shown in FIG. 1. The positioning pieces 362 are arranged at lower ends of the guide rails 31, respectively. Each positioning piece 362 has a pair of left and right receiving nails 362a adjacent to both side faces of each guide rail 31, and is driven back and forth by a cylinder 364. Each positioning piece 362 is usually kept at a predetermined position, as shown in FIG. 1, to receive and stop the left and right leads 11 of a sliding IC 10 by the receiving nails 362a, and to position the IC 10 by using the leads 11 as a reference. The IC 10 is then pushed and located on the guide rail 31 by the hand 44, and the positioning piece 362 moves to the front. The hand portion 40 comprises the pivotable plate 42 supported by a pair of the left and right side plates 41 through the supporting shaft 411; the hand supporting plate 43 connected to the pivotable plate 42 and movable up and down; a plurality (four, in this embodiment) of the hands 44 arranged side by side corresponding to the respective guide rails 31 of the inclined portion 30 and fixed to the supporting plate 43; the cylinder 45 fixed to the pivotable plate 42 to move the hands 44 together with the hand supporting plate 43 up and down; and the cylinder 46 having a rod 461 connected to the pivotable plate 42 to pivot the hands 44 around the supporting shaft 411. Each hand 44 comprises an IC holding mechanism and an IC inserting mechanism. The hand 44 holds the IC 10 at a first pivoted position $P_1$ on an inclined center line $C_2$, which is inclined by an inclination angle $\beta$ (in this embodiment, $\beta=35°$ C.) with respect to a vertical center line $C_1$, and transfers the IC 10 to a second pivoted position $P_2$ on the vertical center line $C_1$ to insert the IC 10 into the printed circuit board 15 (into a socket 16 in this embodiment) at the second pivoted position.

In this embodiment, the size of a gap (pitch) $W_1$ (FIG. 2) between the hands 44 is set to be twice the size of a gap (pitch) $W_2$ between the rows of sockets 18 shown in FIG. 3. The pitch $W_2$ between the sockets 18 is set to 25.4 mm, and therefore, the pitch between the hands 44 is set to $W_1=2W_2$, i.e., $W_1=50.8$ mm. Accordingly, when inserting the ICs 10 into the printed circuit board 15 shown in FIG. 3, the ICs 10 are cyclically inserted into four 13-socket rows among eight socket rows by four hands 44 when the printed circuit board is moves in the one direction, and cyclically inserted into four 12-socket rows when the printed circuit board 15 moves in the opposite direction. Namely, by the movement of the printed circuit board 15 in two different directions 100

ICs 10 can be inserted into the printed circuit board 15. If, for example, one lot comprises ten printed circuit boards 15, i.e., 1000 ICs 10, according to the present embodiment the one lot of ICs can be inserted within a short time of 30 minutes, so that the IC insertion time will be greatly reduced. Also, according to the present embodiment, the number of hands 44 can be easily increased and decreased as and when required.

As described above, the inclined portion 30 of the present invention realizes an automatic supply of electronic parts (ICs 10) having leads from an upper part to a lower part of the inclined portion 30 by allowing the electronic parts to slide down under their weight. The electronic parts (ICs 10) which are positioned by the positioning mechanism 36 at the lower portion of the inclined portion 30 are transferred from the inclined portion 30 onto the printed circuit board 15, which is located horizontally, and are easily and automatically inserted into the printed circuit board 15 by the hand portion 40. As a result, the present invention has a simple structure and can greatly reduce the time needed for insertion of the electronic parts, and can achieve an excellent effect in that static electricity is thereby prevented from flowing into the electronic parts through contact with human operators.

Another embodiment of the present invention will be described with reference to FIGS. 6 and 7, in which the stick container cassette 21 and other components are arranged horizontally for the sake of simplification of the drawings. Further, to assist an easy understanding, specific stick containers will be represented by the reference marks 22-1, 22-2, and 22-3. The main feature of this embodiment exists in the structure of stick container portion 20 shown in FIGS. 1 and 2. The embodiment comprises stick container cassettes 21 each receiving stick containers 22 which are stacked in a multistory state; a stick container front receiving member 211 and a stick container rear receiving member 212 provided at front and rear portions of the bottom of each stick container cassette 21 respectively; a feeding gate opening portion for the feed) 215 provided at a lower forefront portion of each stick container cassette 21 to feed ICs 10 (electronic parts); a gate opening/closing plate 214 for opening and closing the gate 215; and IC 10 guide member 32 provided on the upper end side of each guide rail of an inclined portion 30; a stick container thrusting member 33; a receiving member actuating piece 34 for moving the stick container front receiving member 211 forward; and an opening/closing plate actuating member 39 for moving the gate opening/closing plate 214 upward. A stick container receiving mechanism 21A comprises the stick container front receiving member 211, the stick container rear receiving member 212, and the receiving member actuating piece 34. A gate opening/closing mechanism 21B comprises the gate opening/closing plate 214, the feeding gate 215, and the opening/closing plate actuating member 39.

Figure 5A:
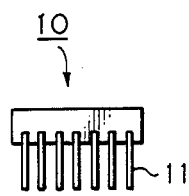
Figure 5B:
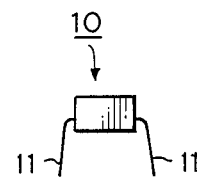

Each of the stick container cassettes 21 is made of transparent plastic in the form of a box having an open top and an open bottom. Left and right side plates 21a and 21b are spaced by a predetermined gap "K" (FIG. 7), and the front and rear surfaces of the left and right side plates 21a and 21b are fixed to front and rear plates 21c and 21d. The lower edge portions of the left and right side plates are fixed in a pair of engaging members 21e and 21f (front half portion) and another pair of engaging members 21g and 21h (rear half portion). Each of the enaging members 21e, 21g, 21g, and 21h has a belt-like projection formed at the center portion of the inner side of each engaging member. Each of the belt-like projections extends in a front and rear direction, and the lower edges of the left and right side plates 21a and 21b are fitted to the projections. As shown in FIG. 1, the front side of stick container cassette 21 is inclined downward. The stick container cassette 21 is arranged on the stick container cassette supporting frames 24 and 25 (FIG. 1) to accommodate a plurality of stick containers 22 (22-1 to 22-3) in a multistory state. The numeral 213 represents a discharge opening portion provided at the bottom thereof. As shown in FIG. 1, the stick container cassette 21 is generally disposed on the supporting frames 24 and 25, and the stick containers 22 are supplied to the stick container cassette 21. The stick containers 22 may be received in a multistory state in the stick container cassette 21 in advance, and the stick container cassette 21 can be arranged successively to replace used stick container cassettes 21 on the supporting frames 24 and 25. As described with reference to FIG. 4, the stick containers 22 (22-1 to 22-3) receive the ICs 10 having leads (FIG. 5) in series, are put in the stick container cassette 21 from the top thereof, and stacked therein one upon another. Portions indicated by alternate long and two short dashes lines in FIG. 6 are notched portions 21a provided on the left and right side of plates 21a and 21b to enable easy insertion of the stick containers 22.

As a lower front end portion of the stick container cassette 21, a receiving member guide block 21j is fixed to the left and right engaging members 21e and 21f. A rear half portion of the guide block 21j is divided into left and right branches. A gap between the branches is set so that the stick container 22 can pass and fall through the gap. Between the top of the guide block 21j and the bottom of the belt-like projection of the left and right engaging members 21e and 21f, the stick container front receiving member 211 is held in such a manner that the stick container front receiving member 211 can slide back and forth. A rear half portion of the receiving member 211 is divided into two branches having a gap therebetween such that the stick container 22 can pass therethrough. A front half portion of the receiving member 211 is formed to be able to receive the stick container 22. The receiving member 21l is fitted to a front end surface of the guide block 21j by a front bent portion 211a, and biased rearward by a pair of right and left tension springs 21k which are fitted to the rear bent portions 211b formed at the branches. Rear ends of the springs 21k are fitted to fitting pins 21e which are fixed to belt-like projections of the left and right guide blocks 21e and 21f. The receiving member 211 is pulled and moved frontward by the receiving member actuating piece 34, which is engaged with the front bent portion 211a and disposed on the guide rail 31 side. The actuating piece 34 is driven by a cylinder 341. The stick container rear receiving member 212 is disposed at a lower rear portion of the stick container cassette 21 and fixed to the bottom of a vertical member 21m which is fitted to the belt-like projections of the left and right engaging members 21g and 21h (the rear half portion) and movable back and forth. The vertical member 21m is adjusted and positioned in accordance with the length of the stick containers 22 (22-1 to 22-3), and fixed to the left side plate 21a by a fixing screw 21n. The reference mark 21p represents a long slot provided on the left side plate 21a to guide the fixing screw 21n.

A lower end portion of the front plate 21c of the stick container cassette 21 is notched in an upside-down U-shape and cooperates with the top of stick container front receiving member 211 to form the feeding gate (opening portion for the feed) 215 (FIG. 7) for feeding the ICs 10. The gate opening/closing plate 214 is engaged with and supported by a support member 21q fixed on the front plate 21c, in such a manner that the gate opening/closing plate 214 is movable up and down. An upper bent portion 214a is fitted to an upper and face of the support member 21q. The gate opening/closing plate 214 is provided with a pin 214b which if fixed in an upright position on the upper bent portion 214a, and constantly biased downward by a compression spring 21r which is wound around the pin 214b. An upper end of the compression spring 21r is fitted to the spring receiver plate 21s which is fitted on the front plate 21c. An upper end portion of pin 214b passes slidably through the spring receiver plate 21s. The gate opening/closing plate 214 is moved upward by the opening/closing plate actuating member 39 which abuts from the lower side against the upper bent portion 214a. The actuating member 39 is disposed on the guide rail 31 side and driven by a cylinder 391. The gate opening/closing plate 214 is moved upward to release the upside-down U-shape hollow cross section (FIG. 4) of the stick container 22-1 positioned on the first story.

The IC (electronic part) guide member 32 is arranged on an upper end portion of the guide rail 31 in such a manner that the guide member 32 is slidable back and forth, and driven by a cylinder 321. The guide member 32 is arranged so that it can enter into the feeding gate 215 (FIG. 7) provided at a front lower portion of the stick container cassette 21 and into a groove 22a (FIG. 4) of the stick container 22-1 on the first story to guide the ICs 10 stored in the stick container 22-1 onto the guide rail 31.

The stick container thrusting member 33 is arranged on the guide rail 31 side to be aligned with the upper side of the IC guide member 32 and to be movable back and forth, and driven by a cylinder 331. The stick container thrusting member 33 is arranged so that it can enter into an insertion hole 214c (FIG. 7) which is formed at a lower portion of the gate opening/closing plate 214 to pass therethrough and into a groove 22a (FIG. 4) of the stick container 22-2 on the second story, to temporarily support the stick container 22-2.

Figure 7:
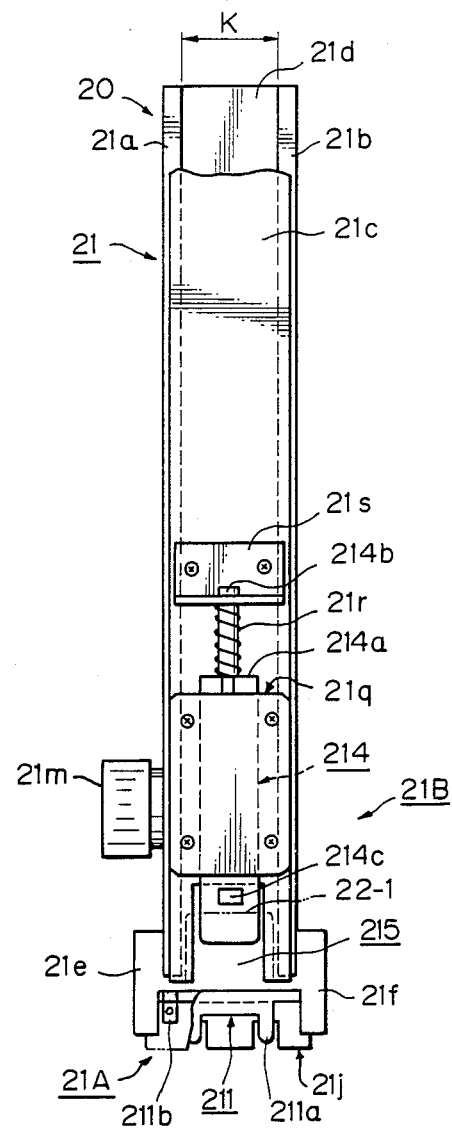
FIG. 7 is a front view showing a stick container portion viewed from the arrow mark A shown in FIG. 6.

This embodiment is constituted as mentioned above and operated as follows:

(a) First, with the gate opening/closing plate 214 lowered as shown in FIGS. 6 and 7, the IC guide member 32 enters the feeding gate 215 (FIG. 7) of the stick container cassette 21 and into the groove 22a (FIG. 4) of the stick container 22-1 on the first story, to support the stick container 22-1.

(b) The gate opening/closing plate 214 is moved upward to open the gate 215. Accordingly, the ICs 10 in the stick container 22-1 slide downward on the guide member 32 under their own weight and are automatically and continuously fed on the guide rail 31 to empty the stick container 22-1.

(c) The gate opening/closing plate 214 is moved downward to return to the original position.

(d) The stick container thrusting member 33 enters the through hole 214c of the gate opening/closing plate 214 and into the groove 22a (FIG. 4) of the stick container 22-2 on the second story to temporarily support the stick container 22-2.

(e) The IC guide member 32 is pulled to the original position.

(f) The stick container front receiving member 211 is pulled toward the front side of the stick container cassette 21. Namely, the front half portion of the receiving member 211 which is receiving the stick container 22-1 is pulled in such a manner that the front half portion of the receiving member 211 will pass the front end of the stick container 22-1. Accordingly, the empty stick container 22-1 passes through the discharge opening portion 213 at the bottom of the stick container cassette 21 and drops into the receiver box 23 shown in FIG. 1 to be stored therein. The receiving member 211 is returned to the original position after the stick container 22-1 has dropped. The operation of (e) and the forward pulling operation of the receiving member 211 in the above (f) may be carried out simultaneously.

(g) The stick container thrusting member 33 is pulled to the original position. As a result, the stick container 22-2 on the second story is dropped on the stick container front receiving member 211 and the rear receiving member 212 and suported thereby. At this time, the stick container 22-3 on the third story and other stick containers on the stick container 22-3 are dropped together with the stick container 22-2. Thus, the operation of the first story stick containers 22-1 is accomplished. After that, the operations of the above (a) to (g) are continuously repeated to successively process the stick containers 22-2, 22-3, and so on, so that the ICs 10 are continuously fed onto each guide rail 31.

As described above, according to the embodiment of the present invention, the stick container receiving mechanism 21A, gate opening/closing mechanism 21B, IC guide member (electronic part guide member) 32, and stick container thrusting member 33 are operated so that the ICs 10 having leads (electronic parts having leads) received in the stick container holding member 21 together with the sticks (22, 22-1, 22-2, 22-3, ...) can be fed continuously and smoothly to each guide rail 31 of the inclined portion 30, and the empty stick containers (22, 22-1, 22-2, 22-3, ...) can smoothly be dropped and discharged. As a result, the present invention has a simple structure and greatly contributes to a correct and smooth automatic inserting operation of the electronic parts 10 having leads.

Figure 8:
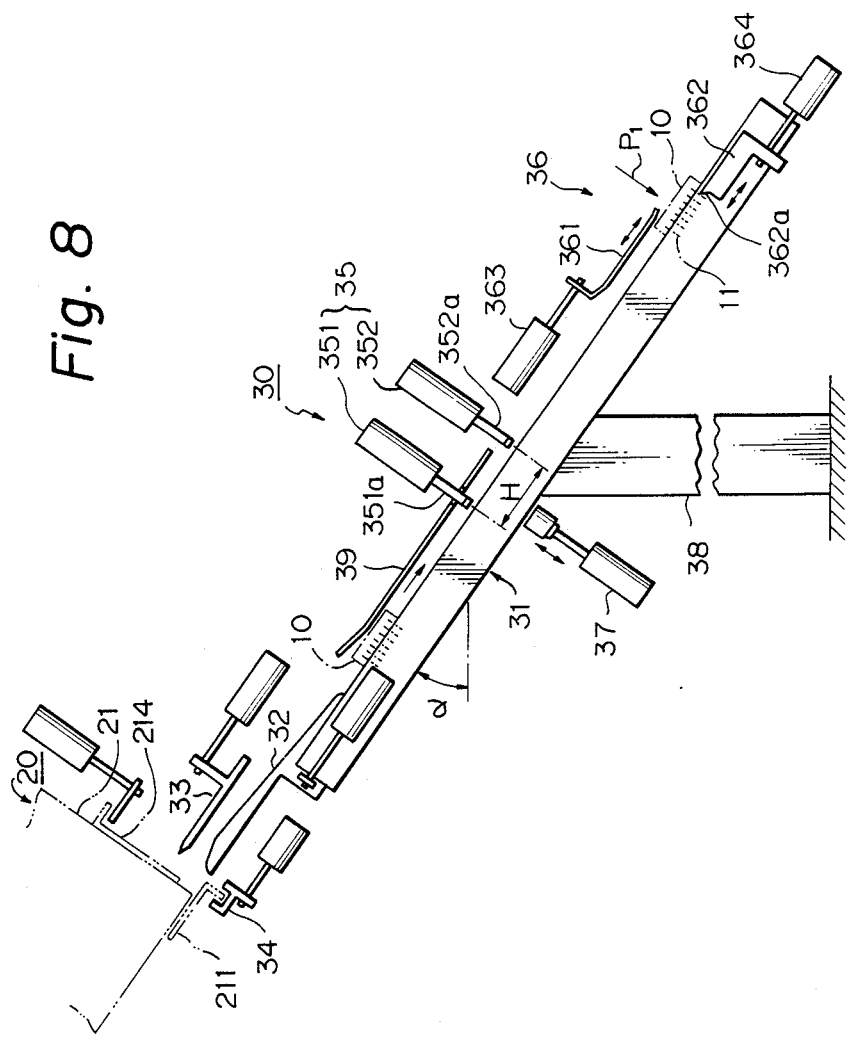
FIG. 8 is a side view showing an embodiment of the present invention.

Another embodiment of the present invention will be described with reference to FIGS. 8 and 9. The feature of this embodiment exists in a positioning mechanism for positioning the ICs 10 having leads (electronic parts having leads) on the inclined portion 30. In FIG. 8, the embodiment comprises basically a guide rail 31 fixed on a supporting frame 38 with an inclination angle of $\alpha$ (in this embodiment, $\alpha = 35°$), which is the same angle as that at which the stick container cassette 21 is inclined, with respect to a horizon; an IC intermittent feeding mechanism 35 arranged in the middle of guide rail 31; and an IC positioning mechanism 36 arranged at a lower end portion of the guide rail 31. In this embodiment, four guide rails 31 are arranged side by side corresponding to respective stick container cassettes 21 (FIG. 1) of a stick container portion 20. At an upper end portion of each guide rail 31, there are provided an IC guide member 32, a stick container thrusting member 33, etc., similar to the previous embodiment, to communicate with the stick container cassette 21. The IC intermittent feeding mechanism 35 is arranged in the middle of each guide rail 31 and comprises a pair of cylinders 351 and 352 which are disposed in series above the guide rail 31.

The intermittent feeding mechanism 35 temporarily stops (stocks) the ICs 10, which are continuously fed from the stick container cassette 21, as will be described later, passed to the IC guide member 32, guided to the upper portion of guide rail 31, and slid downward under their own to the intermittent feeding mechanism 35. The intermittent feeding mechanism 35 then feeds the ICs 10 one by one. A space "H" between the cylinders 351 and 352 is set to be about 1.5 times the length of an IC 10. The IC positioning mechanism 36 comprises basically a guide plate 361 and a positioning piece 362. The guide plate 361 is provided corresponding to the positioning piece 362 on the upstream side of the positioning piece 362, and arranged in parallel with the top of each guide rail 31 to be spaced therefrom so that a slight gap is formed between the guide plate 361 and the top of the IC 10. The guide plate 361 is supported by a supporting member (not shown) in such a manner that the guide plate 361 can reciprocate in a back and forth direction (a longitudinal direction of each guide rail 31), and driven by a cylinder 363. When the ICs 10 are fed and slid one by one from the intermittent feeding mechanism 35, a forefront of the guide plate 361 proceeds near to the positioning piece 362 as shown in FIG. 8 to prevent the IC 10 from jumping out of position and to settle the IC 10 when the IC 10 is stopped by the positioning piece 362. After that, the guide plate 361 is retracted rearward (upstream of the guide rail 31) from the position shown in FIG. 8 to be spaced from the IC 10. The positioning piece 362 is arranged at the lower end of each guide rail 31 in such a manner that it can reciprocate in a back and forth direction (a longitudinal direction of the guide rail 31), has a pair of left and right receiving nails 362a adjacent to both side faces of the guide rail 31, and is driven by a cylinder 364. The positioning piece 362 is usually kept at a predetermined position shown in FIG. 8 to receive and stop the left and right leads 11 of the IC 10 which is fed from the intermittent feeding mechanism 35 and sliding under its own weight, by the receiving nails 362a, and to position the IC 10, using the leads 11 as a reference, at a predetermined position on an inclined surface of the guide rail 31, i.e., at a position corresponding to a first pivoted position of a hand 44 (FIG. 1) indicated by the reference mark $P_1$. After the IC 10 is pushed and positioned by the hand 44, the positioning piece 362 moves frontward. The positioned IC 10 is then held by the hand 44 (FIG. 1). As described above, the leads of the IC 10 are received and stopped to position the IC 10 by using the leads 11 as a reference so that the positioning of the IC 10 will be performed accurately. Further, an advantage is provided in that the leads 11 act to give a kind of cushioning effect when the IC 10 abuts against the positioning piece 362. In FIG. 8, 39 represents an IC guide plate fixed on the upstream side of the intermittent feeding mechanism 35, and this IC guide plate 39 is slightly spaced from the top of the IC 10.

The operation of the above embodiment will be described with reference to FIG. 9, in which specific ICs are represented by the reference marks 10-1, 10-2, and 10-3 to assist with an easy understanding. The reference marks 351a and 352a represent reciprocating piston rods of the cylinders 351 and 352 respectively.

Figure 9A:
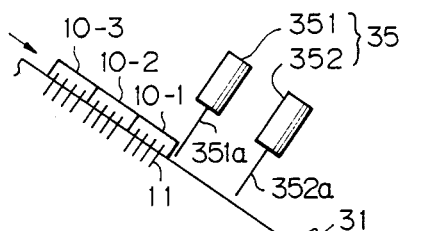
FIG. 9 is a view explaining the operation of the embodiment of the present invention.

As shown in FIG. 9(A), the rods 351a and 352a project, and the rod 351a stops the ICs 10-1 to 10-3 which are sliding downward on the guide rail 31.

Figure 9B:
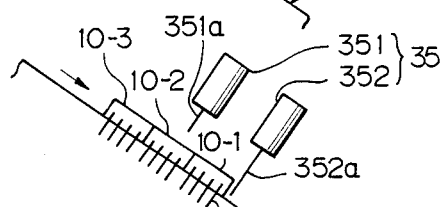

In FIG. 9(B), the rod 351a retracts to allow the ICs 10-1 to 10-3 to pass, and then the rod 352a stops the ICs 10-1 to 10-3.

Figure 9C:
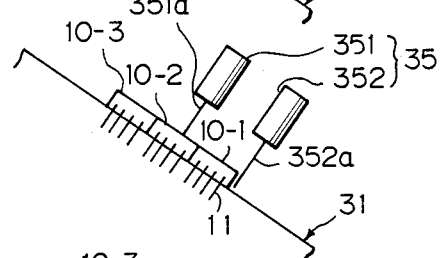

In FIG. 9(C), the rod 351a projects to push and position the IC 10-2 on the guide rail 31.

Figure 9D:
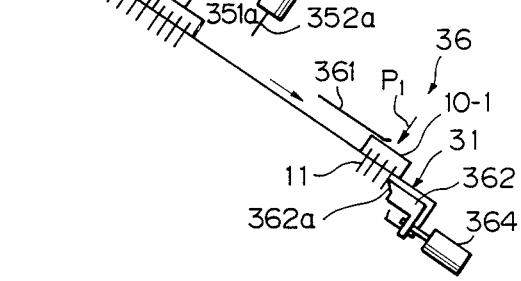

In FIG. 9(D), the rod 352a retracts to release the IC 10-1. Accordingly, the IC 10-1 slides downward on the guide rail 31 under its own weight, and is stopped and positioned by the positioning piece 362 as described before. The rod 352a then projects and the rod 351a retracts, to become in a state as shown in FIG. 9(B), and the operations shown in FIGS. 9(C) and 9(D) then follow. The ICs 10-2 and 10-3 are then successively and intermittently fed and positioned by the positioning piece 362.

In the above embodiment, the positioning operations do not necessarily start from the operation of FIG. 9(A), but may start from the operation of FIG. 9(B) if required.

As described above, according to the present invention, the electronic parts 10 having leads can be fed one by one the intermittent feeding mechanism 35 arranged in the middle portion of the guide rail 31, which constitutes the inclined portion 30. Further, the electronic parts 10 can be stably and firmly positioned on the guide rail 31 by the positioning mechanism 36 provided at a lower end portion of the guide rail 31. As a result, the present invention has a simple structure and contributes to an accurate and smooth automatic insertion of the electronic parts 10 having leads.

Still another embodiment of the present invention will be described with reference to FIGS. 10 and 11. The feature of this embodiment exists in a holding mechanism for holding an IC 10 having leads (electronic part having leads) which has been positioned on an inclined surface at a lower end portion of the guide rail 31; namely, at a first pivoted position $P_1$ of the hand 44 shown in FIG. 1. The embodiment comprises basically an inclined guide rail 31; a positioning piece (positioning member) 362 disposed at a lower end portion of the guide rail 31; and a hand 44 provided with a pushing member 44-27 for pushing and positioning an IC 10 on an inclined surface, the IC 10 having been placed on the inclined surface (an upper surface of the lower end portion) of the guide rail 31, and clamping nails for clamping the pushed and positioned IC 10 through leads 11 thereof.

As shown in FIGS. 1 and 2, in this embodiment, four guide rails 31 are arranged side by side corresponding to respective stick container cassettes 21 of a stick container portion 20. Each guide rail 31 is inclined by an inclination angle $\alpha$ (in this embodiment, $\alpha=35°$) and fixed on a supporting frame 38. The positioning piece 362 is a component of an IC positioning mechanism 36 and arranged at an lower end portion of the guide rail 31 in such a manner that the positioning piece 362 can reciprocate in a back and forth direction (along the guide rail 31). The positioning piece 362 has a pair of left and right receiving nails 362a adjacent to both side faces of the guide rail 31, and is driven by a cylinder 364. The positioning piece is usually kept at a predetermined position as shown in FIG. 3 to receive leads 11 of a sliding IC 10 by the receiving nails 362a and to position the IC 10 at a predetermined position on an inclined surface of the guide rail 31, i.e., at a position corresponding to a first pivoted position of a hand 44 indicated by the reference mark $P_1$.

Figure 10A:
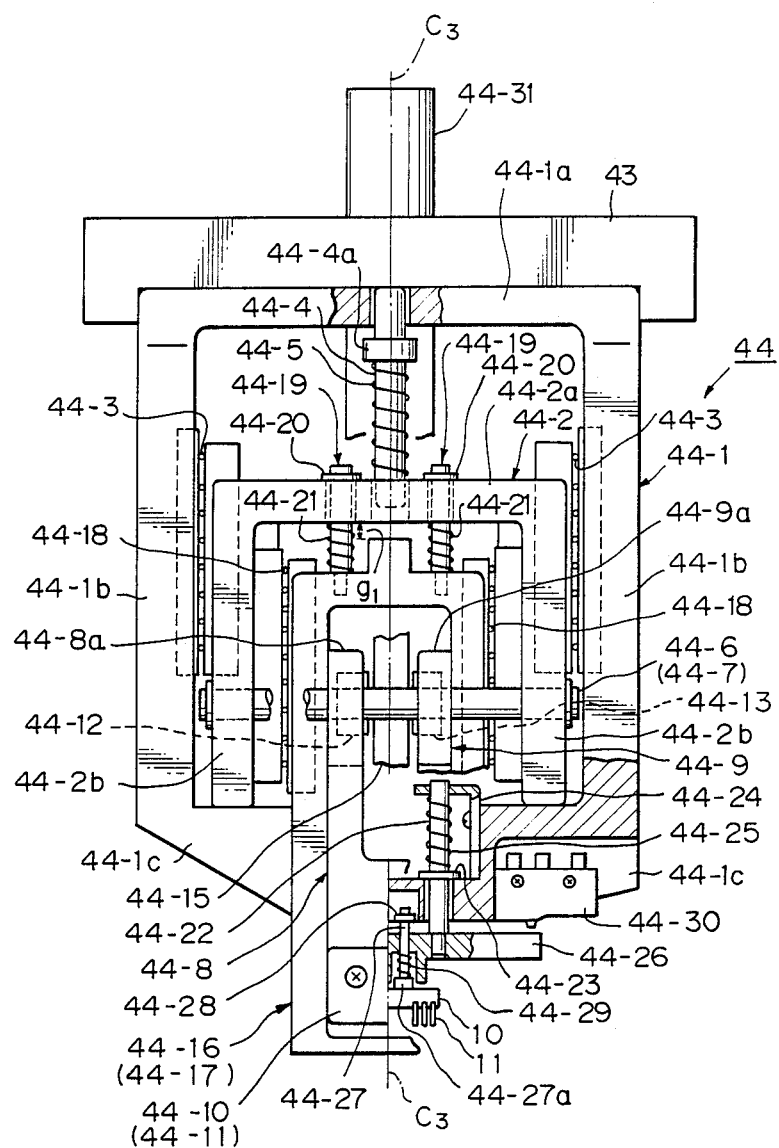
Figure 10B:
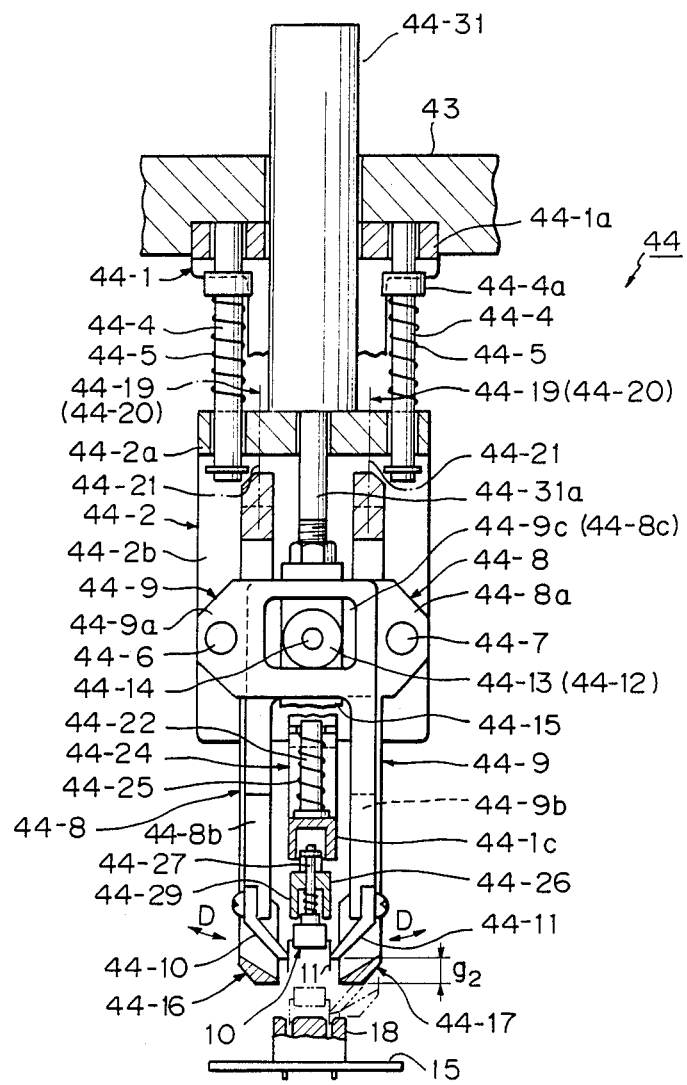

The hand 44 is constituted as shown in FIGS. 10A and B, in which FIG. 10A is a side view partly broken, and FIG. 10B a front view partly broken. An outer frame 44-1 which is a hand proper having a frame shape is fixed to the bottom of a hand supporting plate 43. As shown in FIG. 10A, an inner frame 44-2 of an upside-down U-shape is disposed inside the outer frame 44-1. A pair of front and rear side members 44-1b of the outer frame 44-1 and a pair of front and rear side members 44-2b of the inner frame 44-2 are connected in such a manner that they are slidable up and down relative to each other through ball rollers 44-3. As shown in FIG. 10B, an upper member 44-2a of the inner frame 44-2 is provided with a pair of left and right pins 44-4 which are arranged in parallel with a center line $C_3$ (FIG. 10(A)) to pass slidably through the upper member 44-2a. Upper ends of the pins 44-4 pass through an upper member 44-1a of the outer frame 44-1 and abut against the bottom of the hand supporting plate 43 by which the pins 44-4 are stopped. A spring receiver 44-4a is provided at an upper portion of each of the pins 44-4, and a compression spring 44-5 is wound around each pin 44-4 between the spring receiver 44-4a and the top of the upper member 44-2a. There are provided two springs 44-5 in total which are compressed in advance with a predetermined load (in this embodiment, a 4 kg pre-load is given to the two springs 44-5). Therefore, by the springs 44-5, lower end faces of the side members 44-2b of the inner frame 44-2 are always biased against the tops of the lower members 44-1c of the outer frame 44-1 with a pressure of 4 kg in total. Supporting shafts 44-6 and 44-7 are arranged to pass through the side members 44-2b of the inner frame 44-2 (FIG. 10(B)). Clamping arm 44-9 and 44-8 are rotatably supported by the supporting shafts 44-6 and 44-7. Lower portions of the clamping arms 44-8 and 44-9 are arranged to perform the opening and closing movement in a left and right direction, i.e., in a direction indicated by an arrow mark D shown in FIG. 10B. the clamping arm 44-8 is formed to have substantially an L-shape side face as shown in FIG. 10A, and to have substantially an upside-down L-shape front face as shown in FIG. 10B. An end portion of an upper portion 44-8a of the clamping arm 44-8 is rotatably supported by the supporting shaft 44-7 as described above, and a clamping nail 44-10 is fixed to a lower portion 44-8b of the clamping arm 44-8. An upper portion 44-9a of the clamping arm 44-9 is formed in a left and right inverted shape with respect to that of the clamping arm 44-8 as shown in FIG. 10B, and a lower portion 44-9b of the clamping arm 44-9 is formed in a front and rear inverted shape with respect to that of the clamping arm 44-8 as shown in FIG. 10A. An end of the upper portion 44-9a is rotatably supported by the supporting shaft 44-6, and a clamping nail 44-11 is fixed to the lower portion 44-9b. In the center portions of the upper portions 44-8a and 44-9a of the clamping arms 44-8 and 44-9, operation holes 44-8c and 44-9c, respectively, are formed which align with and pass through the center portions. Operation rings 44-12 and 44-13 are arranged in the operation holes 44-8c and 44-9c, respectively. The operation rings 44-12 and 44-13 are rotatably supported by a supporting pin 44-14 (FIG. 10(B)). The supporting pin 44-14 projects from the front end and rear faces of an operation plate 44-15 which is arranged to be movable up and down between the upper portions 44-8a and 44-9a of the clamping arms. The operation plate 44-15 is connected and fixed to an end of a piston rod 44-31a of a cylinder 44-31 which is fixed on an upper surface of the upper member 44-2a of the inner frame 44-2 along the center line $C_3$ (FIG. 10(B)). Therefore, according to the up and down movement of the piston rod 44-31a, the lower portions 44-8b and 44-9b of the clamping arms 44-8 and 44-9 are caused to perform the opening/closing movements in a left and right direction (in a direction indicated by an arrow mark D shown in FIG. 10B around the supporting shafts 44-7 and 44-6, respectively, and through the operation plates 44-15, the operation rings 44-12 and 44-13, and the operation holes 44-8c and 44-9c, respectively. The clamping nails 44-10 and 44-11 are caused to perform the opening/closing movements together with the clamping arms 44-8 and 44-9. According to the movements, the clamping nails 44-10 and 44-11 clamp or release the IC 10. As shown in FIG. 10A, socket pressing members 44-16 and 44-17 each having a frame-like shape are arranged inside the inner frame 44-2. The pressing members 44-16 and 44-17 are connected to the inner frame 44-2 through ball rollers 44-18 in such a manner that the pressing members can slide up and down. As shown in FIG. 10(B), The pressing members 44-16 and 44-17 are arranged as a pair. On upper surfaces of the pressing members 44-16 and 44-17 are fixed two supporting pins 44-19, respectively, i.e., four pieces in total, in parallel with the center line $C_3$. An upper end portion of each pin 44-19 passes slidably through the upper member 44-2a of the inner frame 44-2, and is suspendingly fitted to the upper member 44-2a by a receiver ring 44-20 which is located on top of the upper member 44-2a. Between the lower surface of the upper member 44-2a of the inner frame 44-2 and the upper surfaces of the pressing members 44-16 and 44-17, compression springs 44-21 are wound around pins 44-19, respectively. Therefore, four springs 44-21 in total are arranged to have pre-load which is given to the four springs totally in advance (in this embodiment, the pre-load of about 1.5 kg is given in total for four springs). As a result, the socket pressing members 44-16 and 44-17 are suspendingly fitted to the inner frame 44-2 through the supporting pins 44-19, and, in a free state, pressed constantly downward with a pressure of about 1.5 kg in total (0.75 kg per pressing member) given by the compression springs 44-21. As shown in FIG. 10(A), a pair of front and rear pins 44-22 (only a front pin is shown) pass slidably through the lower member 44-1c of the outer frame 44-1 with the center line $C_3$ being the center of the front and rear pins 44-22. The pins 44-22 are fitted to the upper surface of the lower member 44-1c by receiver rings 44-23 which are disposed in the middle of the pins 44-22, respectively. As shown in FIG. 10(A), a spring receiver plate 44-24 having an upside-down L-shape in cross-section is fixed on an inner surface of the lower member 44-1c. An upper end portion of each pin 44-22 passes slidably through the spring receiver plate 44-24. Between the spring receiver plate 44-24 and the receiver ring 44-23, a compression spring 44-25 is wound around each pin 44-22. There are arranged two springs 44-25 in total to which a predetermined pre-load for two springs (in this embodiment, about 2 kg of pre-load for two springs) is given. Therefore, in a free state, the pin 44-22 is pressed against an upper surface of the lower member 44-1c of the outer frame through the receiver ring 44-23 by the springs 44-25 with the pressure of about 2 kg in total (i kg per pin). A pusher plate 44-26 for pushing the IC 10 is fixed at the lower end portions of the supporting pins 44-22. The pusher plate 44-26 is slightly spaced from a lower surface of the lower member 44-1c of the outer frame. As shown in FIG. 10A, a pressing member 44-27 for pressing the IC 10 is arranged about the center portion of the pusher plate 44-26. The pressing member 44-27 passes slidably through the pusher plate 44-26 in parallel with the center line $C_3$. The pressing member 44-27 has at its lower end a head portion 44-27a for pressing the IC 10, and is fitted to an upper surface of the pusher plate 44-26 by a receiver ring 44-28 which is fixed to the upper end of the pressing member 44-27. Between the lower surface of the pusher plate 44-26 and the head portion 44-27a of the pressing member 44-27, a compression spring 44-29 is wound around the pressing member 44-27. The spring 44-29 is arranged to have a predetermined pre-load (in this embodiment, about 0.05 kg of pre-load). Therefore, in a free state, the pressing member 44-27 is always pressed downward by the spring 44-29 with a pressure of about 0.05 kg so that the head portion 44-27a projects from the lowermost surface of the pusher plate 44-26. In FIG. 10(A), the reference numeral 44-30 represents a microswitch fixed to a recess formed on the lower member 44-1c of the outer frame. The microswitch 44-30 is actuated by the pusher plate 44-26 when an abnormal state such as an erroneous insertion of the IC 10 generates an abnormal signal.

The hand 44 is constituted as mentioned above so that, as will be described later, the pressing member 44-27 can press and position the IC 10 on the inclined surface, and a pair of the left and right clamping nails 44-10 and 44-11 can clamp the IC 10 through the leads 11 of the IC 10. FIG. 10B shows a state in which the IC 10 is clamped in such a manner.

The operation of the above embodiment will be described with reference to FIGS. 11A, B, C, D, and E, in which FIGS. 11C and 11E are front views viewed from the arrow marks $E_1$ and $E_2$ shown in FIGS. 11b and 11D and showing an opening/closing state of the clamping nails 44-10 and 44-11.

As shown in FIG. 11A, the positioning piece 362 stops and positions the IC 10 which is sliding downward on the guide rail 31 under its own weight. In this case, the leads 11 of the IC 10 are stopped by the receiver nails 362a of the positioning piece 362 and positioned with the leads 11 as a reference of the positioning. After that, the hand 44 descends obliquely, and the pressing member 44-27 (the head portion 44-27a) approaches the upper surface of the IC 10.

As shown in FIG. 11B, the head portion 44-27a of the pressing member 44-27 abuts against the upper surface of IC 10, and the pressing member 44-27 is pushed into the pusher plate 44-26 by a predetermined length. (Note, the lowermost surface of the pusher plate 44-26 does not abut against the IC 10.) Accordingly, a compression deflection action is caused in the compression spring 44-29, and due to the pressure of the spring 44-29, the pressing member 44-27 presses and positions the IC 10 on the inclined surface of the guide rail 31. At this time, the front ends (lower ends) of the clamping nails 44-10 and 44-11 are positioned in an open state on the sides of the left and right leads of the IC 10 as shown in FIG. 11(C). In a free state, the left and right leads 11 of the IC 10 are opened outwardly from vertical lines by about 10° C.

As shown in FIG. 11D, the positioning piece 362 moves (retracts) toward the front of the guide rail 31 after the IC 10 is pressed and positioned by the pressing member 44-27.

As shown in FIG. 11E, the clamping nails 44-10 and 44-11 are closed, and the front edges (lower ends) of the clamping nails press inward on the left and right leads 11 to place the leads 11 in parallel with each other, thereby clamping the IC 10. It is preferable that the leads 11 be pressed and clamped at their lower portions. Thus, the clamping operation of the IC 10 is completed.

As described above, according to the present invention, the electronic part 10 having leads is position on the guide rail 31 through the leads 11 by the positioning piece (positioning member) 362 provided at the lower end portion of the inclined guide rail 31 which constitutes the inclined portion, pressed and positioned on the inclined surface by the pressing member 44-27 of the hand 44, and pressed to be clamped from the sides of leads 11 by a pair of the clamping nails 44-10 and 44-11 after the positioning piece 362 is retracted. In this way, the electronic part 10 can be clamped with an apparatus having a simple structure so that a correct and smooth automatic insertion of the electronic part 10 having leads can be realized.

Further embodiment of the present invention will be described with reference to FIGS. 10 and 12. The feature of this embodiment exists in an insertion mechanism for inserting an IC 10 having leads (electronic part having leads) into a printed circuit board at a second pivoted position $P_2$ of hand 44 shown in FIG. 1. The present embodiment comprises basically a pair of left and right socket pressing members (insertion surface pressing members) 44-16 and 44-17 which are movable up and down by springs; a pair of left and right clamping nails 44-10 and 44-11 which clamp the IC 10 through its leads 11 and is movable near to an insertion surface; and a pusher plate (pusher member) 44-26 for pushing and inserting the IC held by the clamping nails 44-10 and 44-11 into the insertion surface.

The size of a gap $g_1$ shown in FIG. 10(A) between the lower surface of the upper member 44-2a of the inner frame and the uppermost surface of the pressing members 44-16 and 44-17 (in a free state), and the size of a gap $g_2$ shown in FIG. 10(B) between the lowermost surfaces of the clamping nails 44-10 and 44-11 (in a clamping state of the IC 10) and the lowermost surface of the pressing members 44-16 and 44-17 (in a free state) are set to be substantially the same. In this embodiment, the sizes of $g_1$ and $g_2$ are set to about 3.5 mm respectively.

The hand 44 is constituted as mentioned above, and as will be described later, the pressing members 44-16 and 44-17 press the insertion surface (in this embodiment, an upper surface of a socket 18 on a printed circut board 15) for the IC 10 in advance to align the insertion surface with a reference surface (in this embodiment, a horizontal surface); the clamping nails 44-10 and 44-11 holding the IC 10 approaching the insertion surface to guide the leads of the IC 10 toward the top of insertion surface, and the pusher plate 44-26 pushing the IC into the insertion surface. The pressing member 44-17 (44-16) and the clamping nail 44-11 (44-10) indicated by alternate long and two short dashes lines shown in FIG. 10B (only the right side is shown) are in a state such that the clamping nail 44-11 has approached the socket 18 after the pressing member 44-17 has pressed the socket 18.

The operation of the present embodiment will be described with reference to FIG. 12.

Figure 12A:
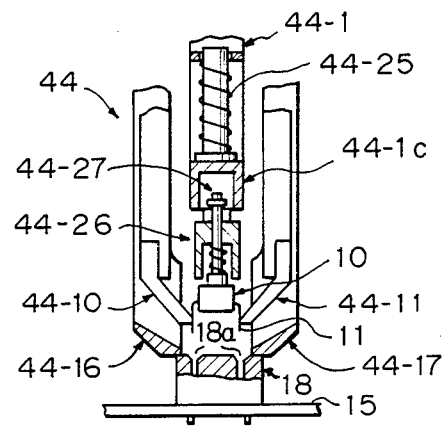

As shown in FIG. 12A, the whole of the hand 44 descends, and lower end surfaces (lowermost surfaces)

of the socket pressing members 44-16 and 44-17 about against an upper surface (insertion surface) of the socket 18, the descending movement of the hand 44 is carried out by the cylinder 45 shown in FIG. 1, as described before. The hand 44 then descends further, and the pressing members 44-16 and 44-17 are pushed inside the outer frame 44-1 (FIGS. 10) so that springs 44-21 (four in total as shown in FIGS. 10.) are compressed and deflected. Due to the spring force of the springs 44-21, the pressing members 44-16 and 44-17 press the upper surface of the socket 18 to align the upper surface (insertion surface) with a reference surface if the upper surface of the socket 18 is inclined with respect to the reference surface (in this embodiment, a horizontal surface) due to warpage of the printed circuit board 15. At this time, the clamping nails 44-10 and 44-11 descend relative to the pressing members 44-16 and 44-17 to approach the socket 18.

Figure 12B:
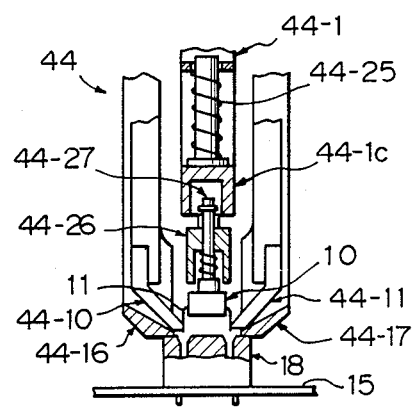

As shown in FIG. 12B, the hand 44 descends further, and the clamping nails 44-10 and 44-11 descend until the lower end faces of the clamping nails 44-10 and 44-11 nearly abut against the upper surface of the socket 18 to align the leads 11 of the IC 10 with insertion holes 18a (FIG. 12A) of the socket 18.

Figure 12C:
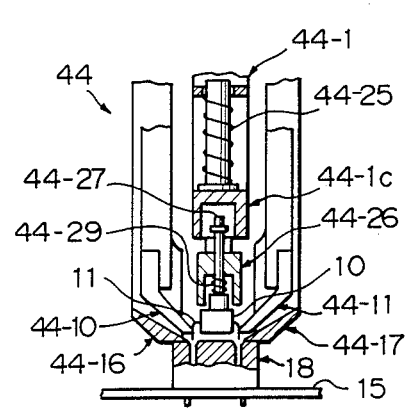

As shown in FIG. 12C, the hand 44 descends further, and the IC pressing member 44-27 is pushed inside the pusher member 44-26 against the compression spring 44-29 wound around the IC pressing member 44-27. The lowermost end face of the pusher member 44-26 abuts against the upper surface of the IC 10 to push it successively so that the leads 11 of the IC 10 are pushed into the insertion holes (FIG. 12(A)) of the socket 18. At this time, the compression spring 44-25 will not be deflected because the insertion pressure of the IC 10 is set to about 1 kg. The leads 11 are inserted by sliding the clamping nails 44-10 and 44-11, and the clamping nails 44-10 and 44-11 clamp the leads 11. Thus, the inserting operation of the IC 10 is completed.

Although the above embodiment shows that the IC 10 is inserted into the socket 18 which is mounted on the printed circuit board 15, the present invention is not limited to this embodiment but obviously is applicable also to a case in which the IC 10 is directly inserted into the printed circuit board 15.

As described above, according to the present invention, the pressing members 44-16 and 44-17 abut in advance against the insertion surface to align the insertion surface with the reference surface, the clamping nails 44-10 and 44-11 hold the leads 11 of the electronic part 10 approaching the insertion surface to align the leads 11 with the insertion holes of the insertion surface, and then the pusher member 44-26 push the electronic part 10 to insert the electronic part 10 into the insertion surface. As a result, a correct and smooth automatic insertion of the electronic part 10 having leads is realized by a simple structure.

I claim:
1. An electronic part insertion apparatus comprising:
   means for holding a printed circuit board;
   an inclined portion inclined by a predetermined inclination angle and having at least one inclined surface on which electronic parts having leads slidably descend under their own weight;
   positioning means, provided at a lower portion of said inclined portion, for positioning said electronic parts on said inclined surface according to the position of the leads of said electronic parts; and
   hand means, pivotable around predetermined supporting points, for holding at a first pivoted position each electronic part which has been positioned on said inclined portion by grasping the leads thereof, moving the held electronic part to a second pivoted position adjacent said printed circuit board and then, at said second pivoted position, inserting each said held electronic part into said printed circuit board.

2. An electronic part insertion apparatus as claimed in claim 1, wherein said positioning means comprises a stopper against which the leads of said electronic parts on said inclined surface slide into abutment.

3. An electronic part insertion apparatus as claimed in claim 1, wherein said printed circuit board includes an insertion surface and a reference surface and wherein said hand means comprises:
   a pressing member pressing each electronic part which has been positioned on said inclined surface against said inclined surface to settle said electronic part thereon;
   insertion surface pressing members pressing and aligning said insertion surface with said reference surface;
   clamping nails for clamping said settled electronic part through the leads holding said electronic parts by the leads thereof, said clamping nails being movable to a position adjacent to said insertion surface; and
   a pusher member for pushing and inserting said electronic parts held by said clamping nails into said insertion surface.

4. An electronic part insertion apparatus comprising:
   means for holding a printed circuit board;
   stick container means for holding stick containers which accommodate identical electronic parts having leads;
   an inclined portion having a predetermined inclination angle and being juxtaposed next to said stick container means allowing said electronic parts in said stick container to slide downward on said inclined portion under their own weight;
   positioning means, provided at a lower portion of said inclined portion, for positioning said electronic parts on said inclined portion according to the position of the leads of said electronic parts; and
   hand means, pivotable around predetermined supporting points, for holding at a first pivoted position each electronic part which has been positioned on said inclined portion, by grasping the leads thereof, moving the held electronic part to a second pivoted position adjacent said printed circuit board and then, at said second pivoted position, inserting each said held electronic part into said printed circuit board.

5. An electronic part insertion apparatus as claimed in claim 4, wherein a plurality of said inclined portions and said stick container means are arranged side by side, respectively, and a plurality of said hand means corresponding to respective inclined portions are provided to insert simultaneously a plurality of electronic parts into said printed circuit board.

6. An electronic part insertion apparatus as claimed in claim 4, wherein said stick container means comprises:
   a stick container holding member having a lower forefront portion and holding a plurality of long size stick containers stacked one upon another having front ends inclined downward, each of said stick containers accommodating electronic parts in series;

a stick container receiving mechanism receiving and holding said stick containers at the bottom of said holding member for dropping and discharging empty stick containers; and gate opening/closing means for feeding said electronic parts to the lower forefront portion of said holding member and to said inclined portion.

7. An electronic part insertion apparatus as claimed in claim 6, wherein said inclined portion includes an upper end portion arranged to face said lower forefront portion of said holding member, and said apparatus further comprises:

an electronic part guide member arranged at the upper end portion of said inclined portion and movable back and forth and engaging temporarily with one of said plurality of stick containers in said holding member; and a stick container thrusting portion arranged above said guide member and movable back and forth and engaging temporarily with another of said plurality of stick containers in said holding member to temporarily hold the stick container.

8. An electronic part insertion apparatus as claimed in claim 6, wherein said inclined portion includes an intermittent feeding mechanism temporarily stopping the electronic parts continuously fed from said plurality of stick containers by said gate opening/closing means, feeding said stopped electronic parts, one by one and intermittently to said positioning means.

9. An electronic part insertion apparatus as claimed in claim 8, wherein said inclined portion has an upstream end and a downstream end and said intermittent feeding mechanism comprises:

upstream end electronic part holding means on the upstream end of said inclined portion for temporarily positioning an electronic part on said inclined surface; and downstream end electronic part holding means on the downstream end of said inclined portion for temporarily positioning electronic parts on said inclined surface of said inclined portion, and said downstream holding means releasing the most downstream electronic part to feed the most downstream part to said positioning means.

10. An electronic part insertion apparatus as claimed in claim 9, further comprising electronic part guiding means, movable on said inclined surface near said positioning means in response to the release of an electronic part by said downstream end electronic part holding means, for absorbing abrupt movement of said electronic part caused when said electronic part is stopped by said positioning means.

11. An electronic part insertion apparatus as claimed in claim 6, wherein:

said stick container holding member comprises a stick container cassette formed in a box shape, having an open top and an open bottom;

said stick container receiving mechanism comprises a stick container front receiving member and a stick container rear receiving member provided at front and rear portions of the bottom of said stick container cassette respectively, and a receiving member actuating piece provided at an upper end portion of said inclined surface to move said stick container front receiving member back and forth; and said gate opening/closing means comprises a feeding gate at a lower portion of a front surface of said stick container cassette, a gate opening/closing plate at an upper portion of the front surface of said stick container cassette to open and close said feeding gate, and an actuating member actuating said gate opening/closing plate, said actuating member being disposed at the upper end side of said inclined surface to move said plate up and down.

12. An electronic part insertion apparatus as claimed in claim 5, wherein said printed circuit board is a testing printed circuit board used for performing a burn-in test on many electronic parts simultaneously.

13. An electronic part insertion apparatus comprising:

an inclined portion inclined by a predetermined inclination angle and having at least one inclined surface on which electronic parts having leads slidably descend under their own weight;

a positioning mechanism, provided at a lower portion of said inclined portion to stop and position said electronic parts, with reference to the position of the leads thereof, on said inclined surface and comprising a stopper means against which the leads of said electronic part sliding on said inclined surface abut; and a hand portion arranged to be pivotable around predetermined supporting points toward the lower portion of said inclined portion to hold at a first pivoted position each electronic part which has been positioned on said inclined portion and then, at a second pivoted position to insert said held electronic part into a printed circuit board located horizontally.

14. An electronic part insertion apparatus comprising:

a stick container portion for holding stick containers which accommodate the same kind of electronic parts having leads and including:

a stick container holding member for holding a plurality of long size stick containers which are stacked one upon another with their front sides being inclined downward, each of said stick containers accommodating electronic parts in series;

a stick container receiving mechanism for receiving and holding said stick containers at the bottom of said holding member and for dropping and discharging and empty stick container; and a gate opening/closing mechanism for feeding said electronic parts to a lower forefront portion of said holding member and to said inclined portion, said lower forefront portion arranged to face said upper end portion;

an inclined portion having a predetermined inclination angle and communicating with said stick container portion to allow said electronic parts which are accommodated in the stick container to slide downward, on said inclined portion under their own weight and having an upper end portion;

a positioning mechanism provided at a lower portion of said inclined portion to stop and position said electronic parts on said inclined portion;

a hand portion arranged to be pivotable around predetermined supporting points toward the lower portion of said inclined portion to hold at a first pivoted position each electronic part which has been positioned on said inclined portion and then, at a second pivoted position, to insert said held electronic part into a printed circuit board which is located horizontally;

an electronic part guide member arranged at the upper end portion of said inclined portion to be movable back and forth and engaging temporarily with a stick container on a first story in said holding member; and a stick container thrusting portion arranged above said guide member to be movable back and forth and engaging temporarily with a stick container on a second story in said holding member to temporarily hold the stick container.

15. An electronic part insertion apparatus comprising:

a stick container portion for holding stick containers, each having a front side, which accommodate the same kind of electronic parts having leads and including:
- a stick container holding member for holding a plurality of stick containers which are stacked one upon another with their front sides being inclined downward, each of said stick containers accommodating electronic parts in series;
- a stick container receiving mechanism for receiving and holding said stick containers at the bottom of said holding member and for dropping and discharging an empty stick container; and
- a gate opening/closing mechanism for feeding said electronic parts to a lower forefront portion of said holding member and to said inclined portion;

an inclined portion having a predetermined inclination angle and communicating with said stick container portion to allow said electronic parts which are accommodated in the stick container to slide downward on said inclined portion under their own weight and having an intermittent feeding mechanism for temporarily stopping the electronic parts which are continuously fed from said stick container by said gate opening/closing mechanism, to feed said stopped electronic parts one by one intermittently to said positioning mechanism, said intermittent feeding mechanism having two electronic part holding means arranged in series on the upstream and downstream sides of said inclined portion respectively, wherein said downstream holding means temporarily positions the most downstream electronic part on said inclined surface of said inclined portion, said upstream holding means then temporarily positioning an electronic part which is located next to said most downstream electronic part, on said inclined surface, and said downstream holding means releasing the positioned most downstream electronic part to feed the same to said positioning mechanism;

a positioning mechanism, provided at a lower portion of said inclined portion to stop and position said electronic parts on said inclined portion;

a hand portion arranged to be pivotable around predetermined supporting points, toward the lower portion of said inclined portion to hold at a first pivoted position each electronic part which has been positioned on said inclined portion, and then, at a second pivoted position, to insert said held electronic part into a printed circuit board which is located horizontally; and an electronic part guiding means which advances on said inclined surface near said positioning mechanism in response to the release of positioning of the electronic part by said downstream holding means to absorb an abrupt movement of said electronic part caused when said electronic part is stopped by said positioning mechanism.

16. An electronic part insertion apparatus comprising:

a stick container portion for holding stick containers, each having a front side, which accommodate the same kind of electronic parts having leads, said stick container portion including:
- a stick container holding member, having a stick container cassette formed in a box shape having an open top and an open bottom, for holding a plurality of said stick containers which are stacked one upon another with their front sides being inclined downward, each of said stick containers accommodating electronic parts in series;
- a stick container receiving mechanism, having a stick container front receiving member and a stick container rear receiving member which are provided at front and rear portions of the bottom of said stick container cassette respectively, and a receiving member actuating piece which is provided at an upper end portion of said inclined surface (guide rail) to move said stick container front receiving member back and forth and for receiving and holding said stick containers at the bottom of said holding member and for dropping and discharging an empty stick container; and
- a gate opening/closing mechanism, having a feeding gate provided at a lower portion of a front surface of said stick container cassette, a gate opening/closing plate provided at an upper portion of the front surface of said stick container cassette to open and close said feeding gate, and an actuating member for actuating said gate opening/closing plate, said actuating member being disposed at the upper end side of said inclined surface (guide rail) to move said plate up and down, for feeding said electronic parts to a lower forefront portion of said holding member and to said inclined portion;

an inclined portion having a predetermined inclination angle and communicating with said stick container portion to allow said electronic parts which are accommodated in the stick container to slide downward, on said inclined portion under their own weight;

a positioning mechanism provided at a lower portion of said inclined portion to stop and position said electronic parts on said inclined portion; and a hand portion arranged to be pivotable around predetermined supporting points toward the lower portion of said inclined portion to hold at a first pivoted position each electronic part which has been positioned on said inclined portion.

* * * * *